US010194531B2

(12) United States Patent
Ohtsu

(10) Patent No.: US 10,194,531 B2
(45) Date of Patent: Jan. 29, 2019

(54) WIRING BOARD AND CONNECTION STRUCTURE

(71) Applicant: FUJI XEROX CO., LTD., Minato-ku, Tokyo (JP)

(72) Inventor: Shigemi Ohtsu, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 92 days.

(21) Appl. No.: 15/336,904

(22) Filed: Oct. 28, 2016

(65) Prior Publication Data

US 2017/0347453 A1 Nov. 30, 2017

(30) Foreign Application Priority Data

May 27, 2016 (JP) .................... 2016-106005

(51) Int. Cl.
| | | |
|---|---|---|
| H02B 1/00 | (2006.01) | |
| H05K 1/14 | (2006.01) | |
| H05K 1/02 | (2006.01) | |
| H05K 1/11 | (2006.01) | |
| H05K 3/36 | (2006.01) | |
| H05K 3/24 | (2006.01) | |

(52) U.S. Cl.
CPC ............ *H05K 1/144* (2013.01); *H05K 1/028* (2013.01); *H05K 1/111* (2013.01); *H05K 1/117* (2013.01); *H05K 3/363* (2013.01); *H05K 3/243* (2013.01); *H05K 2201/0154* (2013.01); *H05K 2201/068* (2013.01); *H05K 2201/09036* (2013.01); *H05K 2201/09172* (2013.01); *H05K 2201/09781* (2013.01); *H05K 2201/10977* (2013.01)

(58) Field of Classification Search
USPC ........................................................ 174/261
See application file for complete search history.

(56) References Cited

U.S. PATENT DOCUMENTS

| | | | | |
|---|---|---|---|---|
| 5,163,847 A | * | 11/1992 | Regnier | ............ H01R 12/7005 |
| | | | | 439/157 |
| 2004/0174663 A1 | * | 9/2004 | Itokawa | ................ H05K 1/147 |
| | | | | 361/600 |

FOREIGN PATENT DOCUMENTS

| | | |
|---|---|---|
| JP | 5-36871 U | 5/1993 |
| JP | 2009-239023 A | 10/2009 |
| WO | 2004/001605 A1 | 12/2003 |

\* cited by examiner

*Primary Examiner* — William H Mayo, III
*Assistant Examiner* — Krystal Robinson
(74) *Attorney, Agent, or Firm* — Sughrue Mion, PLLC

(57) ABSTRACT

Provided is a wiring board including a substrate formed of an insulation material, and plural conductive patterns including plural electrodes arranged on a surface of the substrate along an end surface of the substrate, and plural wiring patterns connected to the plural electrodes, respectively, wherein the substrate includes a notch formed between electrode groups each of which includes a predetermined number of the electrodes.

21 Claims, 6 Drawing Sheets

WIRING BOARD AND CONNECTION STRUCTURE

CROSS-REFERENCE TO RELATED APPLICATIONS

This application is based on and claims priority under 35 USC 119 from Japanese Patent Application No. 2016-106005 filed May 27, 2016.

BACKGROUND

Technical Field

The present invention relates to a wiring board and a connection structure.

SUMMARY

According to an aspect of the invention, there is provided a wiring board including:

a substrate formed of an insulation material; and plural conductive patterns including plural electrodes arranged on a surface of the substrate along an end surface of the substrate, and plural wiring patterns connected to the plural electrodes, respectively, wherein the substrate includes a notch formed between electrode groups each of which includes a predetermined number of the electrodes.

BRIEF DESCRIPTION OF THE DRAWINGS

Exemplary embodiments of the present invention will be described in detail based on the following figures, wherein:

FIG. 2A is a sectional view taken along line A-A in FIG. 1, illustrating a state before heating, and.

FIGS. 4A and 4B are views for explaining a self-alignment mechanism of an anisotropic conductive paste, in which FIG. 4A is a sectional view of the major part before heating, and FIG. 4B is a sectional view of the major part after heating;

DETAILED DESCRIPTION

Figure 1:
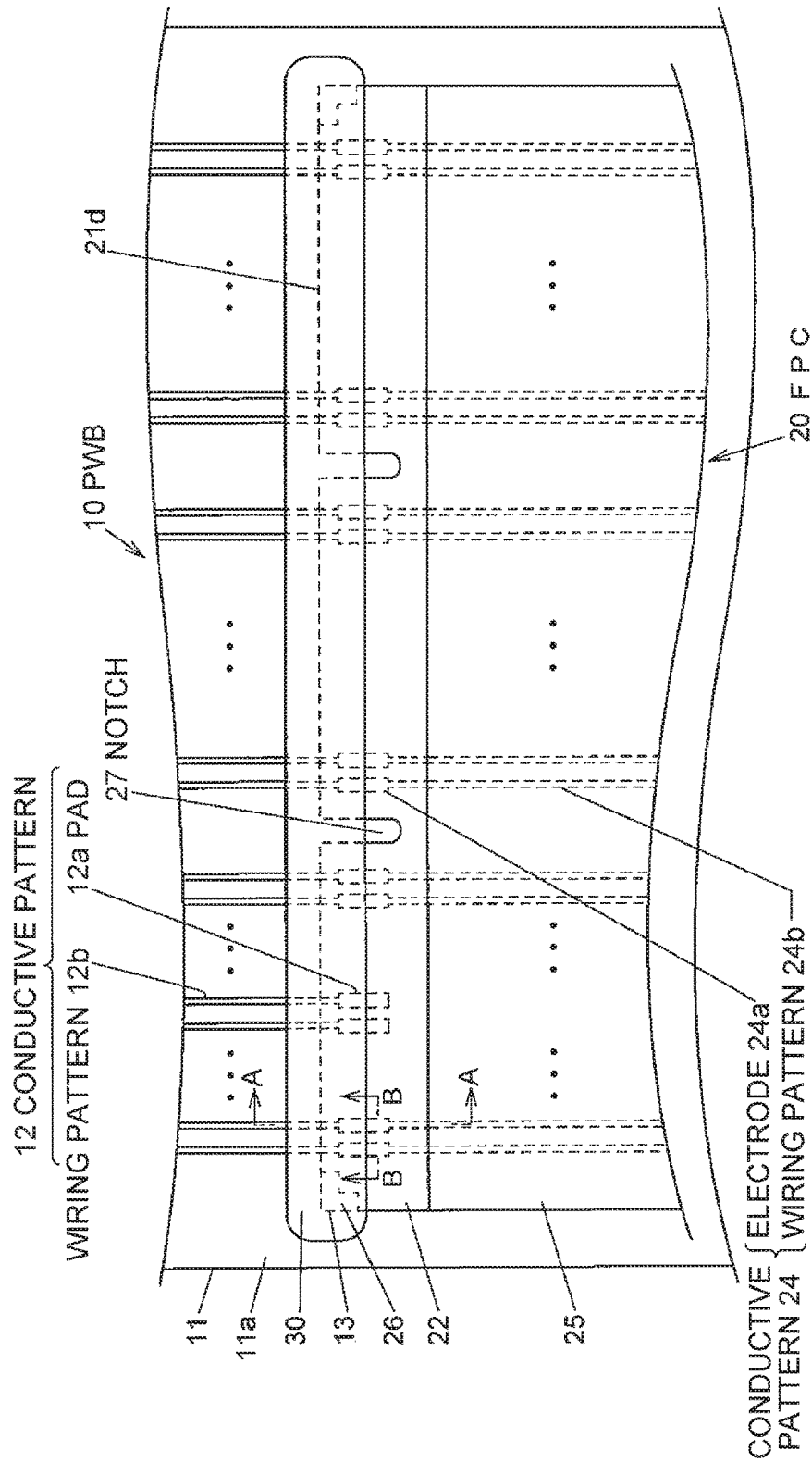
FIG. 1 is a plan view illustrating the major part of a conductor connection structure according to an exemplary embodiment of the present invention.

Hereinafter, exemplary embodiments of the present invention will be described with reference to the accompanying drawings. In addition, in each drawing, constituent elements that have substantially the same function are designated by the same reference numerals, and a repeated description thereof will be omitted. Further, a scale or shape in the drawings may include a portion emphasized in order to make it easy to understand the features of the present invention, and are not necessarily the same as the scale or shape of a practical member.

[First Exemplary Embodiment]

Figure 2A:
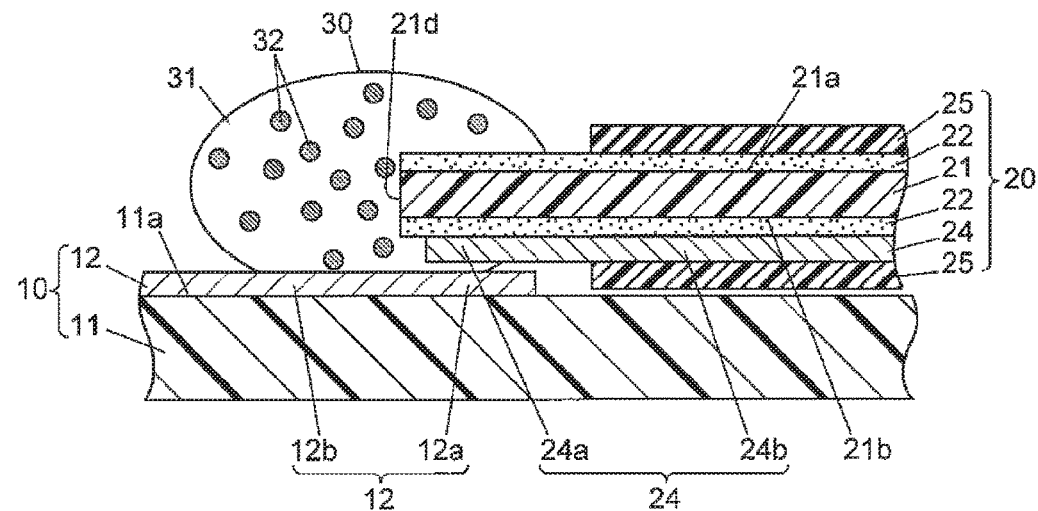
Figure 2B:
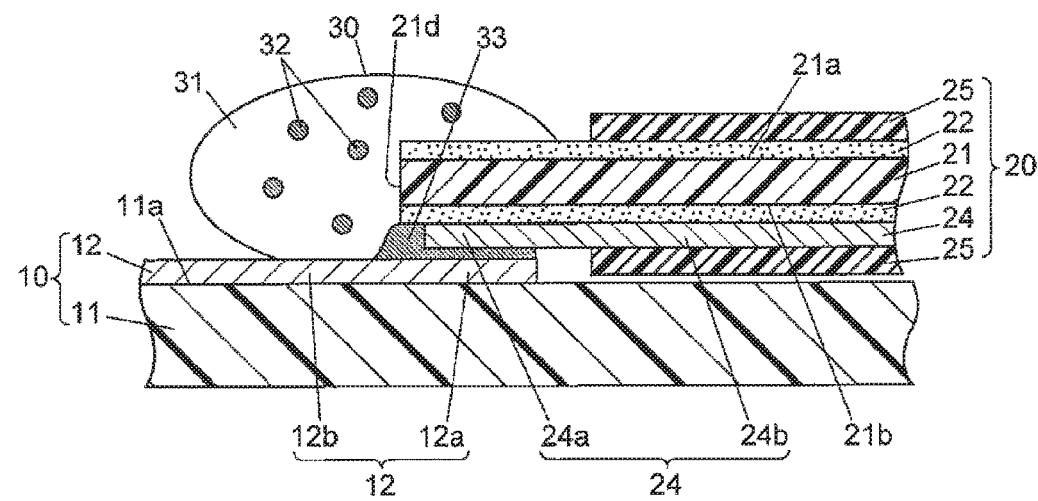
FIG. 2B is a sectional view taken along line A-A in FIG. 1, illustrating a state after heating.
Figure 3:
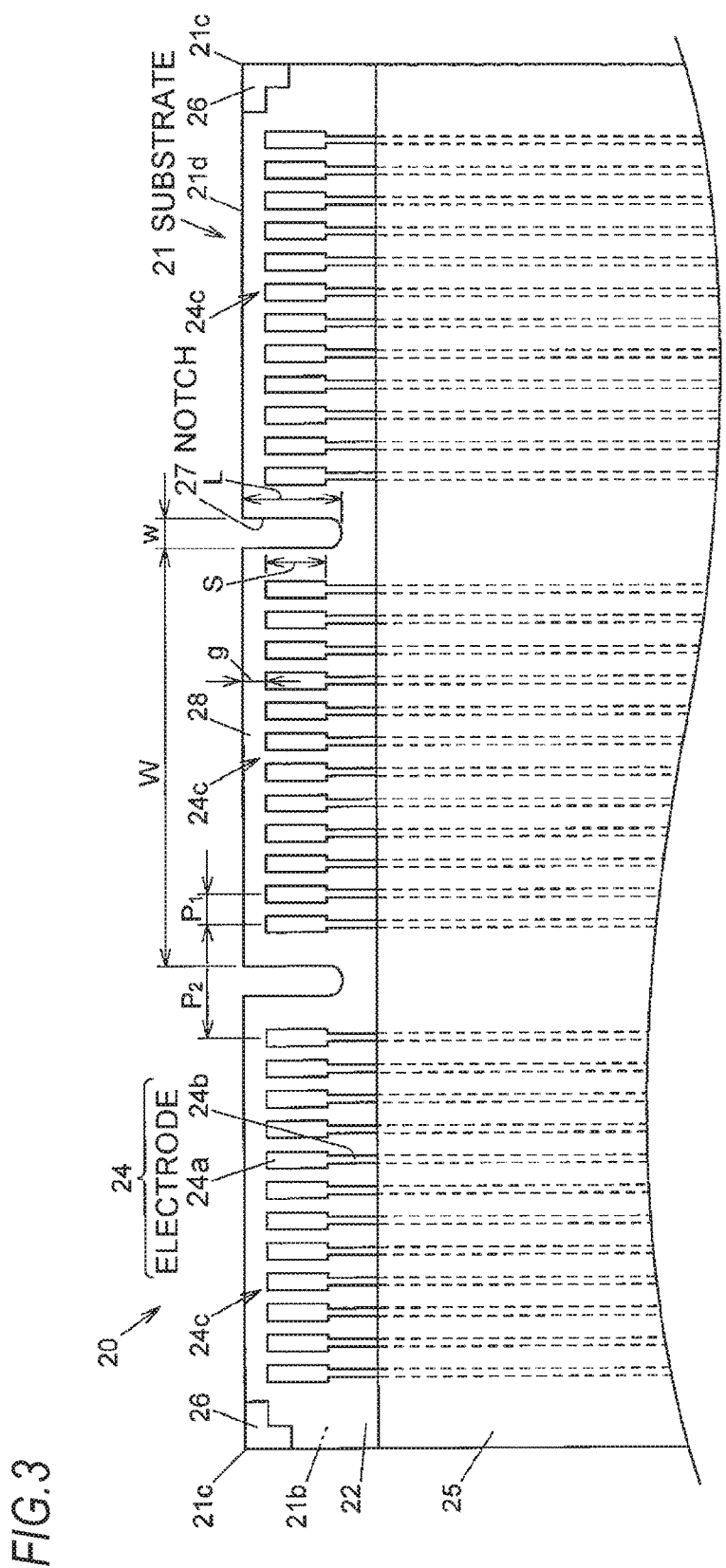
FIG. 3 is a plan view illustrating the major part of a flexible printed circuit board which is viewed from the mounting surface side thereof.

FIG. 1 is a plan view illustrating the major part of a conductor connection structure according to a first exemplary embodiment of the present invention. In addition, FIG. 1 illustrates a state before heating. FIG. 2A is a sectional view taken along line A-A in FIG. 1, illustrating a state before heating, and FIG. 2B is a sectional view taken along line A-A in FIG. 1, illustrating a state after heating. FIG. 3 is a plan view illustrating the major part of a flexible printed circuit board, which is viewed from the mounting surface side thereof.

As illustrated in FIG. 1, the conductor connection structure according to the present exemplary embodiment includes a printed wiring board (hereinafter referred to as "PWB") 10 a flexible printed circuit board (hereinafter referred to as "FPC") 20 mounted on the PWB 10, and an anisotropic conductive paste 30 that connects a pad 12$a$ of the PWB 10 and an electrode 24$a$ of the FPC 20 by soldering merely by heating. Here, the PWB 10 is one example of a connection target board. The FPC 20 is one example of a wiring board. The anisotropic conductive paste 30 is one example of an anisotropic conductive material.

(Configuration of PWB)

As illustrated in FIG. 1 and FIGS. 2A and 2B, the PWB 10 is a rigid board that includes a substrate 11 formed of an insulation material (e.g., a glass epoxy resin), plural conductive patterns 12 formed on the mounting surface 11$a$ of the substrate 11, and a pair of dummy patterns 13. Instead of the PWB 10, a flexible printed circuit board may be used.

Each conductive pattern 12 includes a pad 12$a$ and a wiring pattern 12$b$ connected to the pad 12$a$. The dummy patterns 13 are formed at positions corresponding to dummy patterns 26 of the FPC 20 (see FIG. 3), which will be described below.

(Configuration of FPC)

As illustrated in FIGS. 1 to 3, the FPC 20 includes a substrate 21 formed of an insulation material (e.g., polyimide) and having a first major surface 21$a$ and a second major surface 21$b$, a protective layer 25 formed on the first major surface 21$a$ side of the substrate 21 via an adhesive layer 22, plural conductive patterns 24 formed on the second major surface 21$b$ side of the substrate 21 via an adhesive layer 22, and a pair of dummy patterns 26 formed on corner portions 21$c$ of the second major surface 21$b$ of the substrate 21.

Preferably, the dummy pattern 26 may also be formed at a position spaced apart from each of the corner portions 21$c$ by a distance of about 5 mm to 20 mm in a direction opposite to an end surface 21$d$, in addition to the corner portions 21$c$. This enables the connection by the anisotropic conductive paste 30 to be reinforced.

The plural conductive patterns 24 include plural electrodes 24$a$ arranged on the second major surface 21$b$ of the substrate 21 along the end surface 21$d$ of the substrate 21, and wiring patterns 24$b$ connected to the plural electrodes 24$a$, respectively. The width of the electrodes 24$a$ is formed to be greater than the width of the wiring patterns 24$b$. The plural conductive patterns 24 form a gap (e.g., 0.1 mm or more) with the end surface 21$d$ of the substrate 21. The plural conductive patterns 24 and the dummy patterns 26 are formed of a metal foil (e.g., a copper foil). An Au plating may be applied to the surface of the electrodes 24$a$ in order to secure sufficient reliability, but may be replaced by an Ni plating, or no plating may be applied.

The substrate 21 includes notches 27, each of which is formed between each two adjacent electrode groups 24c, each of which is formed of a predetermined number of (two or more) electrodes 24a. A portion of the substrate 21 between the notches 27 serves as a connection portion 28. The thickness of the substrate 21 may be 50 μm or less or 30 μm or less in order to secure flexibility. The notches 27 are longer than the length from the end surface 21d to the rear ends of the electrodes 24a in a direction intersecting (e.g., a direction orthogonal to) the end surface 21d of the substrate 21. That is, the notches 27 have a length L that is longer than the sum of the gap g and the length S of the electrodes 24a. When the FPC 20, which is formed of a different material from the PWB 10, is heated, a positional deviation occurs due to a difference in thermal expansion coefficients. The FPC is often used in a state where plural electrodes are typically formed at a pitch of from 0.2 mm to 1.0 mm. In particular, when the pitch is narrow, an allowable value for the positional deviation is small and high-precision positioning is required. For example, when the pitch between the electrodes 24a is 0.2 mm, erroneous contact occurs due to simply the positional deviation of 0.1 mm. The notch 27 in the present exemplary embodiment functions to suppress the positional deviation caused by the difference in thermal expansion coefficients between the PWB 10 and the FPC 20 during the connection by soldering.

The electrodes 24a in each electrode group 24c are formed at a first pitch $P_1$, and adjacent electrodes 24a between any one electrode group 24c and another electrode group 24c adjacent thereto are formed at a second pitch $P_2$, which is greater than the first pitch $P_1$. The first pitch $P_1$ between the electrodes 24a of each electrode group 24c may be in a range of from 0.2 mm to 1.0 mm.

Assuming that the difference in thermal expansion coefficients between the substrate 21 of the FPC 20 and the substrate 11 of the PWB 10 is $\Delta\sigma$ ($10^{-6}$/K) and the temperature difference between the heating temperature and the room temperature when the FPC 20 and the PWB 10 are connected to each other is $\Delta T$ (K), the width W (mm) of the connection portion 28 may be represented by the following Equation (1).

$$W < \{P_1/(2\times\Delta\sigma\cdot\Delta T)\} \quad (1)$$

For example, assuming that $P_1=0.5$ mm, $\Delta\sigma=14.9\times10^{-6}$/K, and $\Delta T=156$ K, the right side of Equation (1) is as follows:

Right Side=$\{0.5/(2\times14.9\times10^{-6}\times156)\}=107.6$ mm

It is practical to set the width K of the connection portion 28 to be 53.8 mm (W=107.6 mm/2=53.8 mm) or less by adding a margin to the above relationship.

In addition, for example, assuming that $P_1=0.2$ mm, $\Delta\sigma=14.9\times10^{-6}$/K, and $\Delta T=156$ K, the right side of Equation (1) is as follows:

Right Side=$\{0.2/(2\times14.9\times10^{-6}\times156)\}=43.0$ mm

It is practical to set the width K of the connection portion 28 to be 21.5 mm (W=43.0 mm/2=21.5 mm) or less by adding a margin to the above relationship.

The FPC 20 is manufactured as follows, for example. A board having one surface to which, for example, a Cu foil is bonded is prepared. Patterning is performed on the Cu foil through photolithography so as to form a circuit including plural conductive patterns 24 and a pair of dummy patterns 26. An end surface 21d side of the electrodes 24a is etched so as to provide a gap g between the electrodes 24a and the end surface 21d. Subsequently, the FPC 20 is manufactured by stacking a polyimide film as a thermal compression film which becomes the protective layer 25.

(Configuration of Anisotropic Conductive Paste)

The anisotropic conductive paste 30 is obtained by dispersing a low-temperature solder (hereinafter simply referred to as "solder") 32, of which the melting point is, for example, 185° C. or less, in a polymer material 31. When the anisotropic conductive paste 30 is heated, the solder 32 dispersed in the polymer material 31 is moved and grown (also referred to as "aggregated") so as to form a solder growth portion 33 on a conductor when the conductor is located nearby (e.g., at a distance of 1 mm or less).

Figure 4A:
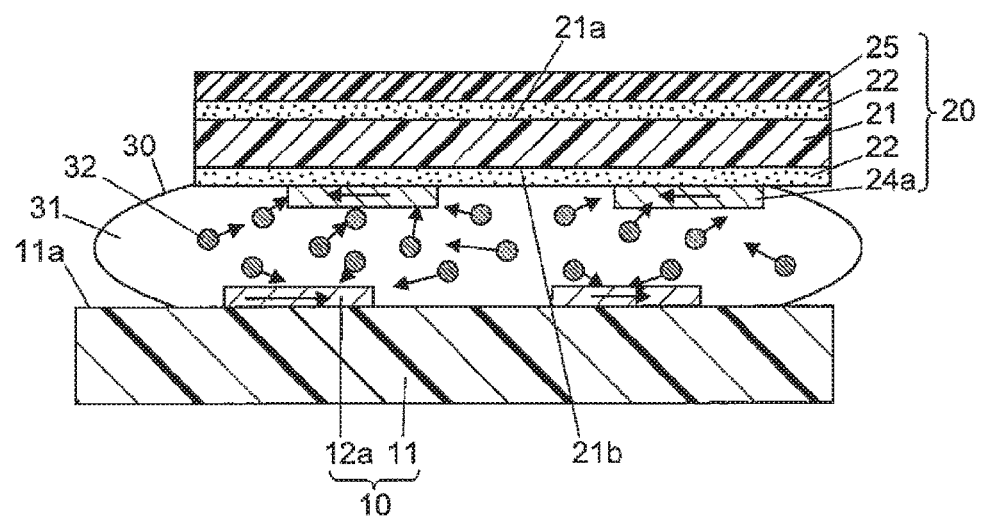
Figure 4B:
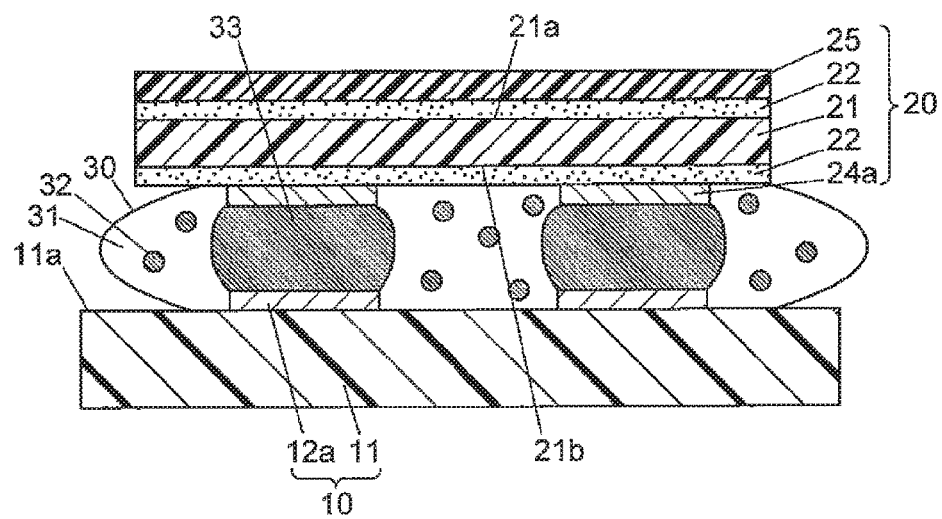

FIGS. 4A and 4B are views for explaining a self-alignment mechanism of the anisotropic conductive paste 30, in which FIG. 4A is a sectional view of the major part before heating, and FIG. 4B is a sectional view of the major part after heating.

Before the anisotropic conductive paste 30 is heated, because the solder 32 is in the dispersed state as illustrated in FIG. 4A, the pads 12a of the PWB 10 and the electrodes 24a of the FPC 20 are not solder-bonded to each other. When the anisotropic conductive paste 30 is heated, because the distance between the pads 12a of the PWB 10 and the electrodes 24a of the FPC 20 is a constant value (e.g., 1 mm) or less, the pad 12a of the PWB 10 and the electrode 24a of the FPC 20 are pulled close to each other in a direction represented by the arrows in FIG. 4A by the self-alignment mechanism included in the anisotropic conductive paste 30, and as illustrated in FIG. 4B, the solder 32 is grown between the pads 12a and the electrodes 24a to form the solder growth portion 33 such that the pads 12a and the electrodes 24a are connected by soldering, respectively.

(Method of Mounting FPC 20 on PWB 10)

Subsequently, an example of a method of mounting the FPC 20 on the PWB 10 will be described. As illustrated in FIGS. 1 and 2A, the anisotropic conductive paste 30 is applied to both sides of the FPC 20 in addition to a region in which the electrodes 24a of the conductive patterns 24 are formed. Thereafter, the anisotropic conductive paste 30 is heated at a temperature of, for example, 150° C. or more for a predetermined time (e.g., 60 seconds) so that a connection is formed by soldering. While the anisotropic conductive paste 30 is heated, the width W of the connection portion 28 is increased, but the variation in the width is absorbed by the notches 27. Therefore, the positional deviation of the electrodes 24a relative to the pads 12a is suppressed even if a difference in thermal expansion coefficients exists between the PWB 10 and the FPC 20.

[Second Exemplary Embodiment]

Figure 5:
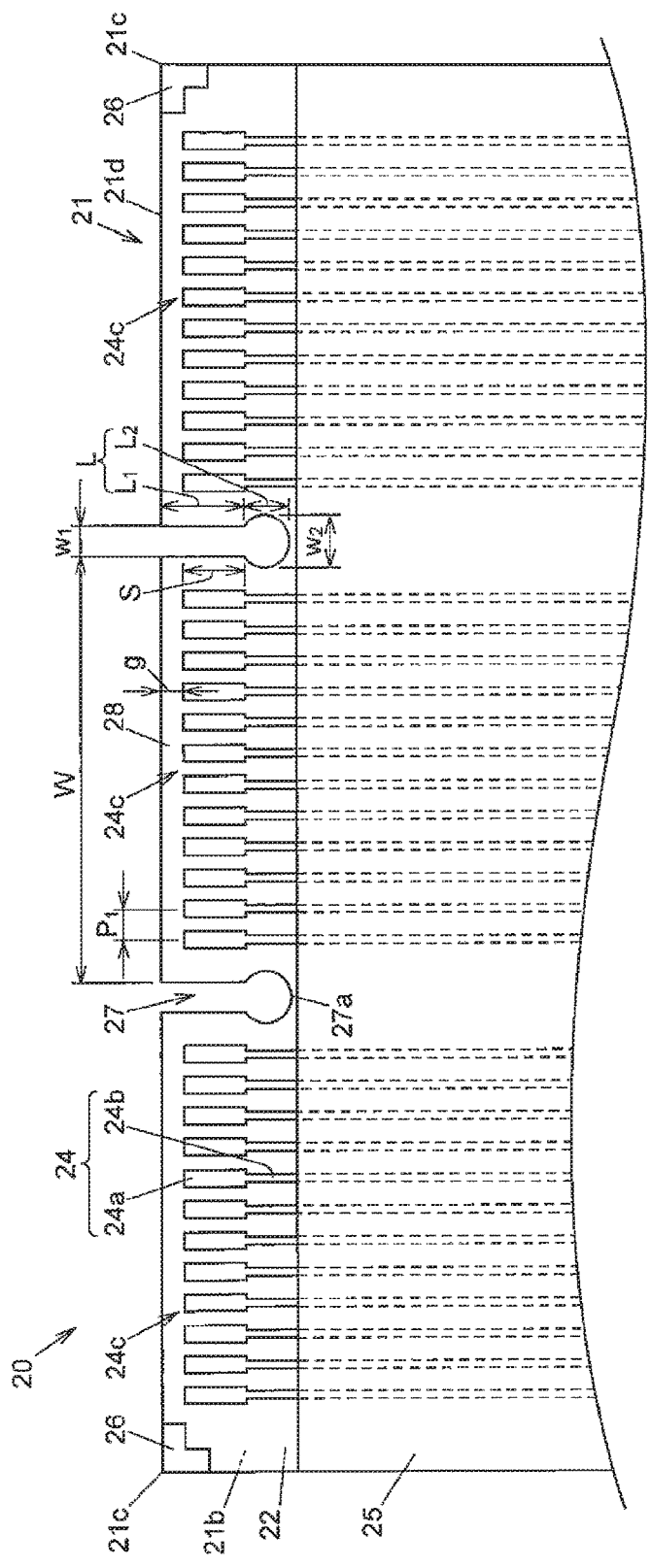
FIG. 5 is a plan view illustrating the major part of a flexible printed circuit board according to a second exemplary embodiment of the present invention, which is viewed from the mounting surface side thereof.

FIG. 5 is a plan view of the major part a flexible printed circuit board according to a second exemplary embodiment of the present invention, which is viewed from the mounting surface side thereof. The present exemplary embodiment is different from the first exemplary embodiment in terms of the shape of the notches 27, and the others are configured in the same manner as the first exemplary embodiment. Hereinafter, descriptions will be made, focusing on the different features therebetween.

Each notch 27 in the present exemplary embodiment includes a circular width-expansion portion 27a at a side opposite to the end surface 21d of the substrate 21. The notch 27 has a first width $w_1$ at the side of the end surface 21d of the substrate 21, and the width-extension portion 27a opposite to the side of the end surface 21d of the substrate 21 has a second width $w_2$, which is greater than the first width $w_1$. The portion of the notch 27 having the first width $w_1$ has a length $L_1$, and the portion having the second width $w_2$ has a length $L_2$. The notch 27 has a length L longer than the sum of the gap g and the length S of the electrode 24a. In addition, the length $L_1$ of the portion of the notch 27 having the first width $w_1$ is substantially the same as the sum of the gap g and the length. S of the electrode 24a. According to the present exemplary embodiment, the notch 27 is more easily deformed than that in the first exemplary embodiment by forming the width-expansion portion 27a at the side opposite to the end surface 21d of the substrate 21.

[Third Exemplary Embodiment]

Figure 6:
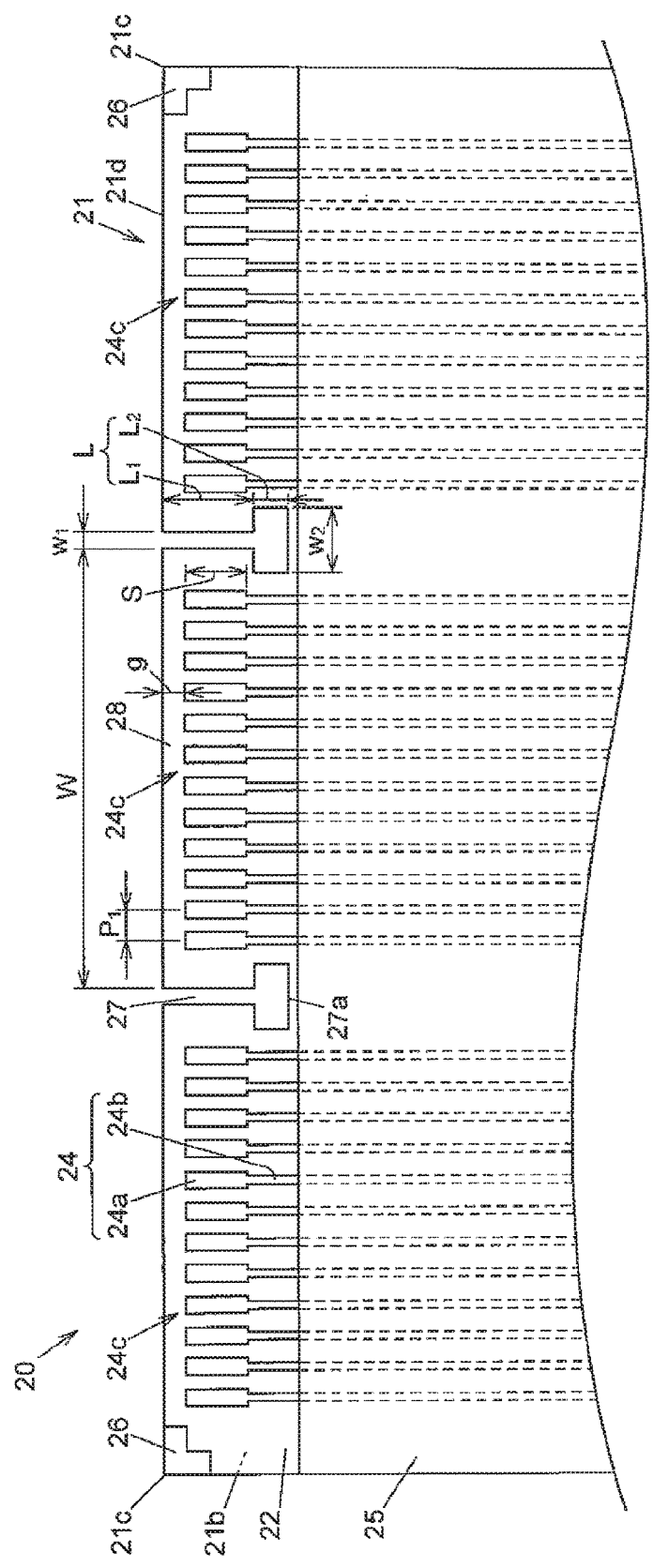
FIG. 6 is a plan view of the major part of a flexible printed circuit board according to a third exemplary embodiment of the present invention, which is viewed from the mounting surface side thereof.

FIG. 6 is a plan view of the major part of a flexible printed circuit board according to a third exemplary embodiment of the present invention when viewed from the mounting surface thereof. The present exemplary embodiment is different from the first exemplary embodiment in terms of the shape of the notches 27, and the others are configured in the same manner as the first exemplary embodiment. Hereinafter, descriptions will be made, focusing on the different features therebetween.

Each notch 27 in the present exemplary embodiment further includes a rectangular width-expansion portion 27a at a side opposite to the end surface 21d of the substrate 21. The dimensional relationship is the same as that in the second exemplary embodiment. That is, in the present exemplary embodiment, the following relationships: $w_2 > w_1$, $g+S \approx L_1$, and $g+S<L$ are satisfied. According to the present exemplary embodiment, the notch 27 is more easily deformed than that in the first exemplary embodiment by forming the width-expansion portion 27a at the side opposite to the end surface 21d of the substrate 21.

Hereinafter, although the present invention will be described in detail with reference to examples, the present invention is not limited to these examples.

EXAMPLE 1

Example 1 corresponds to the first exemplary embodiment. The circuit and the electrodes 24a are formed on the FPC 20 by performing a processing, such as, for example, etching. This is a general specification in which an Au plating is applied to the electrodes 24a. The first pitch $P_1$ between the electrodes 24a is 0.3 mm. When measuring thermal expansion coefficients, the thermal expansion coefficient of the FPC 20 is 26.8 ppm/K and the thermal expansion coefficient of the PWB 10 formed of an FR4 board is 14.0 ppm/K, and thus, the difference $\Delta\sigma$ between the thermal expansion coefficients is 12.8 ppm/K.

While it is not necessary to consider the difference between thermal expansion coefficients when FPCs are connected, it is necessary to consider the thermal expansion coefficients when different materials are connected to each other. In addition, for a material of a stack structure, such as an FPC, the overall thermal expansion coefficient may not be determined only based on the thermal expansion coefficient of the substrate 21, and the pitch between the electrodes 24a or the width W of the connection portion 28 needs to be calculated based on actually measured values including the adhesive layer 22 or the like.

The FPC 20 is manufactured in which the width W of the connection portion 28 is 75 mm and the notches 27 are formed between the connection portions 28. The total width of the FPC 20 is 130 mm and the FPC 20 includes three connection portions 28.

Subsequently, the FPC 20 is connected to the PWB 10. First, the anisotropic conductive paste (an anisotropic conductive paste manufactured by SEKISUI CHEMICAL CO., LTD.) 30 is applied to a connection target portion. At this time, the fixing of the FPC 20 does not need to be performed in a state where the FPC 20 is accurately positioned, but is performed in a state where the FPC 20 is movable to some extent. Subsequently, when the anisotropic conductive paste 30 is heated at 180° C. for 60 seconds, it has been found that the solder 32 moves to the vicinity of the electrodes 24a, which enables the electrodes 24a and the pads 12a to be well connected by soldering.

EXAMPLE 2

Example 2 corresponds to the second exemplary embodiment. In addition, Example 2 differs from Example 1 in terms of the pitch between the electrodes 24a of the FPC 20, the width of the connection portion 28, and the overall width of the FPC 20. In Example 2, the first pitch $P_1$ between the electrodes 24a is 0.2 mm, the width W of the connection portion 28 is 25 mm, and the overall width is 85 mm. In Example 2, the FPC 20 is connected to the PUB 10 formed of an FR4 board, using the anisotropic conductive paste 30 through a method that is the same as that in Example 1.

EXAMPLE 3

Example 3 corresponds to the third exemplary embodiment. In addition, Example 3 differs from Example 1 in terms of the shape of the notches 27, and the FPC 20 is connected to the PWB 10 formed of an FR4 board, using the anisotropic conductive paste 30 through a method that is completely the same as that in Example 1. It has been found that the electrodes 24a and the pads 12a are well connected by soldering.

In addition, the exemplary embodiments of the present invention are not limited to the above-described exemplary embodiments and examples, and may be implemented as various modifications without changing the gist of the present invention. For example, although an FPC has been described as a wiring board in the above-described exemplary embodiments, a flexible flat cable (FFC) may be used as a wiring board. In addition, notches may be formed in a connection target board as in the wiring board.

Some of the constituent elements of the exemplary embodiments may be omitted without changing the gist of the present invention, and addition, omission, change, and replacement and the like of steps may be made in the flow of the exemplary embodiments.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A wiring board comprising:
a substrate comprising an insulation material; and
a plurality of conductive patterns including:
    a plurality of electrodes arranged on a surface of the substrate along an end surface of the substrate; and
    a plurality of wiring patterns connected to the plurality of electrodes, respectively, wherein the substrate includes a notch formed between electrode groups, wherein the notch is formed in an outermost peripheral side edge of the substrate, wherein each of the electrode groups includes a predetermined number of the electrodes, wherein the notch has a first width at the outermost peripheral side edge of the substrate, and wherein the notch has a second width at a side opposite to the outermost peripheral side edge of the substrate, the second width being greater than the first width.

2. The wiring board according to claim 1, wherein the substrate comprises a flexible printed circuit board that has a thickness of 50 µm or less.

3. The wiring board according to claim 2, wherein the electrodes in the electrode groups are formed at a first pitch, and wherein a first one of the electrode groups and a second one of the electrode groups adjacent to the first one of the electrode groups are formed at a second pitch greater than the first pitch.

4. The wiring board according to claim 3, wherein the conductive patterns are formed so that a width of the wiring patterns is smaller than a width of the electrodes, wherein the notch has a first width at the outermost peripheral side edge of the end surface of the substrate, and wherein the notch has a second width at a side opposite to the outermost peripheral side edge of the substrate, the second width being greater than the first width.

5. A connection structure comprising:
the wiring board according to claim 3;
a connection target board on which a plurality of pads are formed; and
an anisotropic conductive material that connects the plurality of electrodes of the wiring board to the plurality of pads of the connection target board, respectively.

6. The wiring board according to claim 2, wherein a length of the notch in a direction perpendicular to the outermost peripheral side edge of the substrate is longer than a length from the outermost peripheral side edge of the substrate to a rear end of the electrodes in the direction perpendicular to the outermost peripheral side edge of the substrate of the substrate.

7. The wiring board according to claim 2, wherein the conductive patterns are formed so that a width of the wiring patterns is smaller than a width of the electrodes, wherein the notch has a first width at the outermost peripheral side edge of the end surface of the substrate, and wherein the notch has a second width at a side opposite to the outermost peripheral side edge of the substrate, the second width being greater than the first width.

8. A connection structure comprising:
the wiring board according to claim 2;
a connection target board on which a plurality of pads are formed; and
an anisotropic conductive material that connects the plurality of electrodes of the wiring board to the plurality of pads of the connection target board, respectively.

9. The wiring board according to claim 1, wherein the electrodes in the electrode groups are formed at a first pitch, and wherein a first one of the electrode groups and a second one of the electrode groups adjacent to the first one of the electrode groups are formed at a second pitch greater than the first pitch.

10. The wiring board according to claim 9, wherein a length of the notch in a direction perpendicular to the outermost peripheral side edge of the substrate is longer than a length from the outermost peripheral side edge of the substrate to a rear end of the electrodes in the direction perpendicular to the outermost peripheral side edge of the substrate of the substrate.

11. The wiring board according to claim 9, wherein the conductive patterns are formed so that a width of the wiring patterns is smaller than a width of the electrodes, wherein the notch has a first width at the outermost peripheral side edge of the end surface of the substrate, and wherein the notch has a second width at a side opposite to the outermost peripheral side edge of the substrate, the second width being greater than the first width.

12. A connection structure comprising:
the wiring board according to claim 9;
a connection target board on which a plurality of pads are formed; and
an anisotropic conductive material that connects the plurality of electrodes of the wiring board to the plurality of pads of the connection target board, respectively.

13. The wiring board according to claim 1, wherein a length of the notch in a direction perpendicular to the outermost peripheral side edge of the substrate is longer than a length from the outermost peripheral side edge of the substrate to a rear end of the electrodes in the direction perpendicular to the outermost peripheral side edge of the substrate.

14. A connection structure comprising:
the wiring board according to claim 13;
a connection target board on which a plurality of pads are formed; and
an anisotropic conductive material that connects the plurality of electrodes of the wiring board to the plurality of pads of the connection target board, respectively.

15. The wiring board according to claim 1, wherein the conductive patterns are formed so that a width of the wiring patterns is smaller than a width of the electrodes.

16. A connection structure comprising:
the wiring board according to claim 1;
a connection target board on which a plurality of pads are formed; and
an anisotropic conductive material that connects the plurality of electrodes of the wiring board to the plurality of pads of the connection target board, respectively.

17. The wiring board according to claim 1, wherein the plurality of wiring patterns extend primarily in a direction perpendicular to the outermost peripheral side edge of the substrate.

18. The wiring board according to claim 17, wherein a length of the notch in the direction perpendicular to the outermost peripheral side edge of the substrate is longer than a length from the outermost peripheral side edge of the substrate to a rear end of the electrodes in the direction perpendicular to the outermost peripheral side edge of the substrate.

19. The wiring board according to claim 1, wherein the notch is configured to suppress positional deviation caused by a difference in thermal expansion coefficients between a connection target board and the wiring board during soldering.

20. The wiring board according to claim 19, wherein the connection target board comprises a plurality of pads, and wherein the notch is configured to suppress positional deviation of the plurality of electrodes relative to the plurality of pads caused by the difference in thermal expansion coefficients between the connection target board and the wiring board during soldering to connect the plurality of electrodes to the plurality of pads.

21. The wiring board according to claim 1, wherein the notch has a length L,
   wherein each one of the plurality of electrodes has a length S,
   wherein each one of the plurality of electrodes is separated from the outermost peripheral side edge of the substrate by a gap having a length g, and
   wherein the length L is longer than a sum of the length S and the length g.

* * * * *